United States Patent
Singh et al.

(10) Patent No.: US 9,406,374 B1
(45) Date of Patent: Aug. 2, 2016

(54) MITIGATING LEAKAGE IN MEMORY CIRCUITS

(71) Applicant: NXP B.V., Eindhoven (NL)

(72) Inventors: Jainendra Singh, Bangalore (IN); Pankaj Agarwal, Bangalore (IN); Patrick van de Steeg, Oss (NL); Jwalant Kumar Mishra, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/882,206

(22) Filed: Oct. 13, 2015

(51) Int. Cl.
 *G11C 11/00* (2006.01)
 *G11C 11/419* (2006.01)
 *G11C 11/418* (2006.01)

(52) U.S. Cl.
 CPC .......... *G11C 11/419* (2013.01); *G11C 11/418* (2013.01)

(58) Field of Classification Search
 CPC .................. G11C 11/419; G11C 11/418
 USPC ......... 365/154, 185.17, 185.12, 49.1, 49.11, 365/49.12, 51, 63, 156, 188, 189.011, 190, 365/202
 See application file for complete search history.

(56) References Cited

U.S. PATENT DOCUMENTS

| 7,692,964 B1 | 4/2010 | Sabharwal et al. |
| 2006/0138245 A1* | 6/2006 | Lee .................. G11C 11/005 235/492 |
| 2013/0135841 A1* | 5/2013 | Pavlovic .............. H05K 9/0047 361/818 |

* cited by examiner

*Primary Examiner* — Fernando Hidalgo

(57) ABSTRACT

An apparatus includes a memory circuit and a word-line driver circuit. The memory circuit includes a plurality of rows of memory cells, each memory cell in a corresponding row having pass transistors connected to a shared word-line. The word-line driver circuit is configured and arranged to enable pass transistors of a first set of memory cells of the memory circuit by applying a first voltage to word-lines of the first set of memory cells, disable pass transistors of a second set of memory cells of the memory circuit by applying a second voltage to word-lines of the second set of memory cells, and mitigate leakage of pass transistors of a third set of memory cells of the memory circuit by applying a third voltage to word-lines of the third set of memory cells, wherein the third voltage is between the first and second voltages.

20 Claims, 5 Drawing Sheets

MITIGATING LEAKAGE IN MEMORY CIRCUITS

OVERVIEW

Aspects of various embodiments are directed to integrated circuit apparatuses and more particularly to apparatuses and methods of mitigating leakage in memory circuits.

Semiconductor memory devices include, for example, static random access memory (SRAM), and/or dynamic random access memory (DRAM). A DRAM memory cell has one transistor and one capacitor, thereby providing a high degree of integration. Because DRAM uses constant refreshing, its power consumption and slow speed limit its use mainly for computer main memory. SRAM, on the hand, is bi-stable, meaning it can maintain its state indefinitely so long as an adequate power is supplied. SRAM can operate at a higher speed with lower power dissipation, so computer cache memories often use SRAMS.

SRAM cells in certain states, including a sleep state (e.g., the circuit is idle), can be subject to leakage. The power resulting from the leakage, as a circuit becomes larger, can be a significant drain of power of the circuit.

These and other matters have presented challenges to efficiencies of memory circuit implementations, for a variety of applications.

SUMMARY

Various example embodiments are directed to apparatus and methods for mitigating leakage in a memory circuit. According to an example embodiment, an apparatus includes a memory circuit and a word-line driver circuit. The memory circuit includes a plurality of rows of memory cells, and each memory cell in a corresponding row has pass transistors connected to a shared word-line. The word-line driver circuit is configured and arranged to enable pass transistors of a first set of memory cells of the memory circuit by applying a first voltage to word-lines of the first set memory cells, disable pass transistors of a second set of memory cells of the memory circuit by applying a second voltage to word-lines of the second set of memory cells, and mitigate leakage of pass transistors of a third set of memory cells of the memory circuit by applying a third voltage to word-lines of the third set of memory cells, wherein the third voltage is between the first and second voltages.

According to embodiments, a method for mitigating leakage includes enabling pass transistors of a first set of memory cells of a memory circuit by applying a first voltage to word-lines of the first set of memory cells. The memory circuit includes a plurality of rows of memory cells, and each memory cell in a corresponding row having pass transistors connected to a shared word-line. The method further includes disabling pass transistors of a second set of memory cells of the memory circuit by applying a second voltage to word-lines of the second set of memory cells, and mitigating leakage of pass transistors of a third set of memory cells of the memory circuit by applying a third voltage to word-lines of the third set of memory cells, wherein the third voltage is between the first and second voltages.

According to embodiments, a method includes mitigating leakage of pass transistors of memory cells of a memory circuit by applying a sleeping voltage to word-lines of the memory cells responsive to the memory circuit being in a sleep mode. The memory circuit includes a plurality of rows of memory cells, and each memory cell in a corresponding row having pass transistors connected to a shared word-line. In response to the memory circuit transitioning from the sleep mode to an active cycle, the method further includes: selecting a block of the memory cells, disabling pass transistors of the memory cells of the selected block by discharging the word-lines of the selected block to a disabling voltage, selecting a shared word-line of the selected block, and enabling pass transistors of a set of the memory cells of the selected block by applying an enabling voltage to the selected shared word-line to activate the respective memory cells, wherein the enabling voltage is greater than the disabling voltage.

The above discussion/summary is not intended to describe each embodiment or every implementation of the present disclosure. The figures and detailed description that follow also exemplify various embodiments.

DESCRIPTION OF THE DRAWINGS

Various example embodiments may be more completely understood in consideration of the following detailed description in connection with the accompanying drawings, in which.

Figure 1:
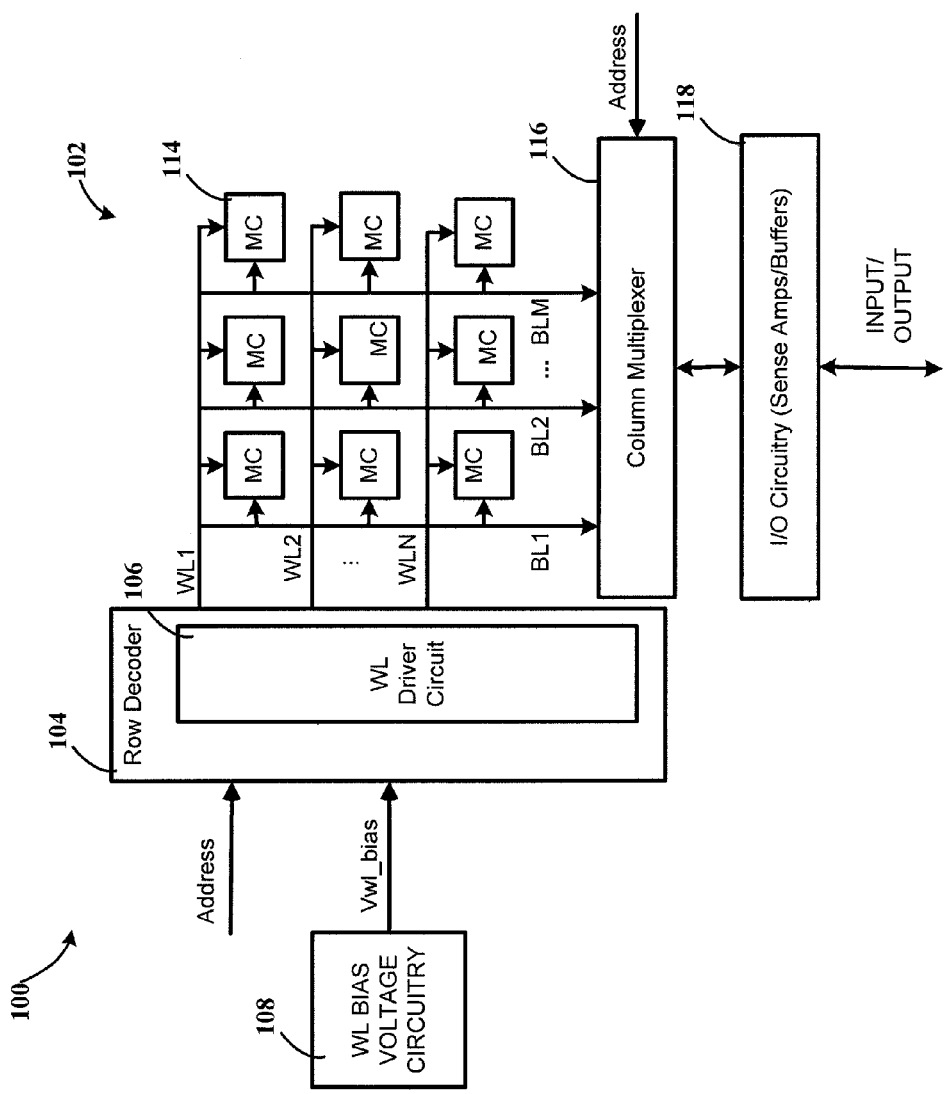
FIG. 1 shows a block diagram of an example memory circuit apparatus according to various embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving a memory circuit comprised of a plurality of rows of memory cells and having a voltage applied to word-lines of particular memory cells to mitigate leakage of the pass transistors of the memory cells. In certain implementations, aspects of the present disclosure have been shown to be beneficial when used in the context of a memory circuit comprised of an array of SRAM cells that mitigates leakage of pass transistors of sleeping SRAM cells of the array. In some embodiments, a source bias voltage can be applied to source terminals of the sleeping memory cells and/or the bit-lines are allowed to be floating to further mitigate leakage. These and other aspects can be implemented to address challenges, including those discussed in the background above. While not necessarily so limited, various aspects may be appreciated through a discussion of examples using such exemplary contexts.

As transistor sizes continue to decrease, memory circuits can suffer from leakage in a sleep state at nominal, room temperature. Essentially, the transistors of memory cells are no longer ideal switches; rather, the transistors are closer to sieves that have a non-negligible constant current flow path from drain to source, from drain/source to substrate, from gate to drain/source/substrate, and/or vice-versa, even in a sleep mode. The generation of static current as leakage can result in an increased static power consumption. Leakage across access devices and/or gates of pass transistors can depend on a gate to drain potential. In accordance with a number of embodiments, word-lines of a set of memory cells in a sleep state can be biased to a non-zero voltage which can reduce and/or mitigate leakage of the pass transistors of the respective set of memory cells. By applying a non-zero voltage to word-lines of memory cells in the sleep state, the potential of the word-line node within a memory cell is raised to mitigate the leakage.

In various aspects, a word-line driver circuit can selectively apply the non-zero voltage to respective word-lines of the set of memory cells in the sleep state. The non-zero voltage can, for example, include a value that is less than a threshold voltage of a threshold gate-to-source voltage differential to create a conducting path between the source and drain terminals of the respective pass transistors (e.g., to enable the pass transistors). For ease of reference, memory cells in a sleep state are sometimes herein generally referred to as "sleeping memory cells."

In various instances, sleeping memory cells include all memory cells and/or a subset of the memory cells of the memory circuit. For example, when the memory circuit is in a sleep mode (e.g., a signal corresponding with the sleep mode is driven high or low), each of the plurality of memory cells of the memory circuit include sleeping memory cells. By contrast, when the memory circuit is in an active cycle (e.g., the signal corresponding with the sleep mode is driven low or high), a block of memory cells can be selected to be activated. The remaining subset of the memory cells that are not in a selected block of memory cells are sleeping memory cells. Biasing the word-lines of pass transistors of sleeping memory cells can be used to mitigate and/or reduce leakage associated with the pass transistors of the sleeping memory cells.

Moreover, in various related aspects, a supply bias voltage is applied to the supply terminals of the sleeping memory cells and the bit-lines are allowed to be floating which can result in additional mitigation of leakage. For example, applying a supply bias voltage to supply terminals of sleeping memory cells can, for instance, raise a ground potential of the ground node within the bitcell and thereby reduce leakage of the pass transistors (which is, as discussed above, due to the gate to drain potential). Further, allowing bit-lines to be floating (e.g., using a high-impedance state so that the bit-lines are not actively driven to a voltage) can mitigate leakage current and result in no path for current to flow through. When the bit-lines are allowed to be floating, one of the two pass transistors of a memory cell can have lower leakage as the gate-to-drain voltage ($V_{gd}$) may not be subject to leakage. However, it has been recognized that the other of the two pass transistors may still be subject to leakage due to the differential of the word-line and the internal value of the memory cell. Applying a voltage to the word-line, applying a supply bias voltage to supply terminals, and allowing the bit-lines of the sleeping memory cells to be floating can be particularly useful in mitigating leakage and surprisingly does not result in a significant adverse affect to the bit-cell hold margin.

In certain embodiments, it has also been recognized that driving the word-lines can improve leakage of the word-line driver circuits and/or buffers. For example, row decoder circuitry, in some aspects, can selectively activate word-lines based on a decoded address. Driving the word-lines of the pre-charge circuit of the word-line driver circuits can reduce the drain-to-source voltage (Vds) of the pre-charge circuit (e.g., a PMOS) of the word-line driver circuit, which can result in mitigating leakage.

Turning now to the figures, FIG. 1 shows a block diagram of an example memory circuit apparatus according to various embodiments of the present disclosure. As illustrated by FIG. 1, various apparatus 100 embodiments include a memory circuit 102 and a word-line (WL) driver circuit 106. The memory circuit 102 includes a plurality of rows of memory cells, such as particular memory cell 114. Each memory cell of the memory circuit 102 in a corresponding row has pass transistors connected to a shared WL (e.g., WL1, WL2, ... WLN). Further, each memory cell of the memory circuit 102 in a corresponding column has pass transistors connected to a shared bit-line (BL) pair (e.g., BL1, BL2, ..., BLM). Each single line illustrated by FIG. 1 of BL1, BL2, and BLM are representations of a BL pair. For example, BL pair BL1 has a first BL, $\overline{BL1}$, and a second BL, BL1.

Access to information stored by the memory cells is facilitated by driving a WL corresponding therewith and outputting/inputting data onto a BL pair corresponding with a selected column for providing the stored data value to the selected output. In total, the memory circuit can include $2^n \times 2^m$ memory cells arranged in an array. The row n and/or column m selected is determined by decoding address information. For example, row decoder circuitry 104 can select memory cells by selecting respective WLs of the memory cells responsive to a decoded address (e.g., a row address). A selected WL can enable the BL pair to be driven according to the stored values. In some implementations, the row decoder circuitry 104 can include an n-bit decoder with $2^n$ output lines, a different one of which is enabled for each different n-bit input code. A column multiplexer 116 can select at least one BL pair based on a decoded address (e.g., a column address) in such a way as to connect the BL pair selectively and to direct the corresponding memory cell output to data registers. For example, the column multiplexer 116 can take m inputs and produce $2^m$ BL access signals, of which 1, 4, 16, 32, or 64 may be enabled at one time.

In various aspects, input/output circuitry 118 can sense power signals from the BLs that represent the data bit (0 or 1) stored by the respective memory cells, and can amplify the voltage swing to recognizable logical levels so that the data can be interpreted by other circuitry. The input/output circuitry 118 can include sense amplifiers, write buffers, and/or similar write driver circuitry. For example, once the data is disposed onto a BL pair, voltage levels on the BL pair begin to separate to opposite power supply rails (e.g. $V_{DD}$ and ground), and the input/output circuitry 118 (e.g., a respective sense amplifier) is used to latch the logic levels sensed on the BL pair after they are separated by a predetermined power voltage difference, which often can be ten-percent or less of $V_{DD}$. In some embodiments, a sense amplifier is at the end of each BL pair (e.g., BL1, BL2, BLM) and amplifies the voltages to a normal logic level. The bit from the respective memory cell is then latched from the sense amplifier corresponding with the respective memory cell into a write buffer.

The WL driver circuit 106, in various embodiments, is configured to selectively apply voltages to WLs of the memory circuit 102. The selective voltages can be responsive to a mode of the memory circuit 102 and/or a state of the respective memory cells (e.g., selection of a block of memory cells, and/or selections of a WL of the memory cells of the selected block). The modes of the memory circuit, in some implementations, include a sleep mode and an active cycle. During a sleep mode, no read or write operations are performed, e.g., the memory circuit can be inactive, and can result in the memory circuit consuming less power than during an active cycle. The memory cells, during a sleep mode, are fully powered. During an active cycle, read and/or write operations can be performed. To transition the memory circuit 102 between the sleep mode and the active cycle, a signal corresponding with sleep mode can be driven high to transition the memory circuit 102 to a sleep mode and then driven low to transition the memory circuit 102 to an active cycle, or vice versa.

The WL driver circuit 106 can enable, disable, and/or mitigate leakage of pass transistors of respective memory cells based on the voltage applied to the shared WLs. For example, the WL driver circuit 106 can enable pass transistors of a first set of memory cells of the memory circuit by applying a first voltage to WLs of the first set of memory cells (e.g., 1.1V), disable pass transistors of a second set of memory cells of the memory circuit by applying a second voltage to WLs of the second set of memory cells (e.g., 0V), and mitigate leakage of pass transistors of a third set of memory cells of the memory circuit by applying a third voltage to WLs of the third set of memory cells (e.g., 0.4V).

An enabling voltage (e.g., the first voltage) turns on the pass transistors of the respective memory cells and, thereby, drives the corresponding BL pairs (e.g., provides a threshold gate-to-source voltage differential to create a conducting path between the source and drain terminals of the respective pass transistors). A disabling voltage (e.g., the second voltage) disables the pass transistors of the respective memory cells. In some instances, BL pairs of memory cells in a selected block can be pre-charged and application of the disabling voltage can include discharging the WLs of the respective memory cells to the disabling voltage. A sleeping voltage (e.g., the third word line bias voltage) can mitigate leakage of the pass transistors that are in a sleep mode. For example, the value of the sleeping (word line bias) voltage can be a non-zero value that is selected to reduce leakage of the gates of the pass transistors of the sleeping memory cells.

In various embodiments, when the memory circuit 102 is in an active cycle, a block of memory cells are selected (e.g., the first and second set of memory cells). Memory cells in the selected block of a memory circuit in an active cycle can have different voltages applied to their respective WLs than sleeping memory cells. For example, the pass transistors of the selected block of memory cells are disabled by applying a disabling voltage to WLs of the selected block. The memory cells in a non-selected block (e.g., the third set of memory cells) have the sleeping voltage applied to their respective WLs. In some implementations, the sleeping voltage can be applied by the WL driver circuit 106 to all of the WLs of the memory cells during a previous sleep mode and can remain applied to the WLs of the non-selected memory cells during the active cycle. The disabling voltage, in such instances, is applied to the WL of the selected block of memory cells by discharging the WLs from the sleeping voltage to the disabling voltage. For example, the disabling voltage can be applied by connecting the respective WLs to ground and thereby discharging WLs of the selected block memory cells to the disabling voltage. A WL of the selected block of the memory circuit 102 can be selected, via the row decoder circuitry 104, to activate the respective memory cells (e.g., active selective memory cells/the first set of memory cells) for a subsequent read/write operation. The pass transistors of the active selected memory cells, which are disabled when a block of memory cells is selected, can be enabled by applying the enabling voltage to the WL of the active selected memory cells.

When the memory circuit 102 is in a sleep mode, each of the memory cells of the memory circuit 102 are in a sleeping state. In such an instance, the WL driver circuit 106 mitigates leakage of the pass transistors of all of the memory cells of the memory circuit 102 by applying the sleeping voltage to the WLs of the memory cells.

In accordance with various related embodiments, the apparatus 100 can include WL bias voltage circuitry 108 configured and arranged to generate the voltages to be selectively applied to WLs of the memory circuit 102. That is, the WL bias voltage circuitry 108 can generate the enabling, disabling, and/or sleeping voltages and can supply the respective voltages to the WL driver circuit 106. In some embodiments, the WL bias voltage circuitry 108 can generate preset voltages designed based on parameters of the memory circuit apparatus 100. In other instances, the WL bias voltage circuitry 108 can be variable and can generate voltages based on inputs from the memory circuit apparatus 100. Further, the WL bias voltage circuitry 108 can be internal or external to the apparatus 100.

In certain embodiments, the apparatus 100 can include a source biasing circuit configured and arranged to apply a source bias voltage to source terminals of sleeping memory cells. For example, when the memory circuit 102 is in a sleep mode, the source biasing circuit can apply the source bias voltage to source terminals of all memory cells of the memory circuit 102. When the memory circuit 102 is in an active mode, the source biasing circuit can apply the source bias voltage to source terminals of the sleeping memory cells. Further, the source bias voltage can be discharged from source terminals of a selected block of memory cells (e.g., the first and second set of memory cells) in response to the memory circuit 102 transitioning from a sleep mode to an active cycle and selection of the block. In some related embodiments, the BLs of the sleeping memory cells can be allowed to be floating. By allowing the BLs of sleeping memory cells to be floating, one of the BLs of a BL pair may not suffer from leakage.

Biasing the source terminals, in addition to the non-zero biasing of the WL and allowing the BLs to be floating, for sleeping memory cells, can be particularly useful for mitigating leakage of sleeping memory cells and can surprisingly not adversely affect the bit-cell hold margin during a sleep mode of the memory circuit. For example, in some embodiments, an additional gain of 1.4× or more can be achieved in a sleep mode using such a scheme in a 40 nm bulk complementary metal-oxide semiconductor (CMOS) technology. Furthermore, surprisingly this may not adversely affect the hold margin of the WL driver circuit 106 and can mitigate leakage of the WL driver circuit 106 because of reduction of the drain-to-source voltage (Vds) of the pre-charge circuit (e.g., a PMOS) of the WL driver circuit 106.

The various embodiments described herein may be combined in certain embodiments, and various aspects of individual embodiments may be implemented as separate embodiments. For instance, aspects of FIGS. 2, 3A, and 3B can be part of the apparatus described in FIG. 1. For example, the memory circuit illustrated by FIG. 2 can be used with a variety of different types of devices. In some instances, various other techniques and/or features can be used in apparatus embodiments to improve device behavior. Example techniques that can be used in connection with the memory circuit apparatus embodiments described and illustrated herein can include pre-charging BLs of memory cells in the selected block, and/or floating BL, among other techniques.

Further, in accordance with various embodiments, an apparatus can include fewer features and/or components than illustrated by FIG. 1. For example, an apparatus embodiment can include a memory circuit and a WL driver circuit. Further, rather than WL bias voltage circuitry being internal to the apparatus, as illustrated by FIG. 1, the WL bias circuitry can be external to the apparatus.

Figure 2:
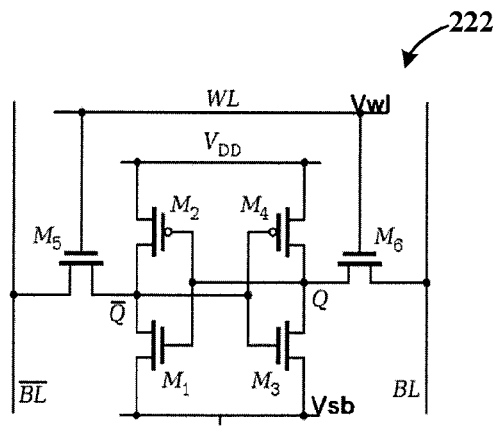
FIG. 2 shows a block diagram of an example memory cell of a memory circuit according to various embodiments of the present disclosure.

FIG. 2 illustrates an enlarged view of a memory cell of a memory circuit, such as the memory circuit illustrated by FIG. 1, in accordance with one or more embodiments of the present disclosure. Semiconductor memory devices can be composed of an array of SRAM cells, and each SRAM cell is operable to store a single bit of information. Access to this information is facilitated by driving a WL corresponding therewith and outputting data onto BL pairs corresponding with a selected column for providing the stored data value to the selected output. Once the data is disposed onto the BL pair ($\overline{BL}$ and BL), voltage levels on the BL pair begin to separate to opposite power supply rails (e.g. $V_{DD}$ and ground), and a sense amplifier is used to latch the logic levels sensed on the BLs after they are separated by a predetermined power voltage difference, which is typically ten-percent or less of $V_{DD}$. The BL pair ($\overline{BL}$ and BL) illustrated by FIG. 2 can include a BL pair illustrated by FIG. 1, such as BL1, in various embodiments.

A SRAM cell 222 can include a plurality of transistors (M1, M2, M3, M4, M5, and M6) that comprises metal-oxide-semiconductor (MOS) transistors. Each bit in an SRAM cell can be stored on a subset of the transistors that form two cross-coupled inverters. For example, transistor M1 and transistor M2 can form a first inverter, and transistor M3 and transistor M4 can form a second inverter, as illustrated by FIG. 2. The SRAM cell 222 has two stable states which are used to denote 0 and 1. Two additional pass transistors (e.g., M5 and M6) serve to control access to the SRAM cell during read and write operations. Access to the SRAM cell is enabled by a WL which controls the two pass transistors M5 and M6, which, in turn, control whether the SRAM cell should be connected to the BLs. The BLs are used to transfer data for both read and write operations. During read operations, the BLs are actively driven high and low by the inverters (e.g., transistors M1, M2, M3, and M4) in the SRAM cell. When a WL is not enabled, the pass transistors M5 and M6 disconnect the SRAM cell from the BLs and the two cross-coupled inverters formed by M1-M4 continue to reinforce one another as long as they are connected to the power supply.

If, for example, a logic "0" was stored on the data node $\overline{Q}$ and a logic "1" was stored on the data node Q, transistor M1 would be turned on and transistor M3 would be turned off. Thus, transistor M1 would pull $\overline{BL}$ low, whereas transistor M3 would swing to a voltage level based on the logic "1" of the data node Q (e.g., pulling BL high), thereby developing the BL differential operable to drive appropriate sense amplifier circuitry for reading data.

As illustrated by FIG. 2, the WL of the SRAM cell 222 can have a voltage applied (e.g., $V_{WL}$). For example, a WL driver circuit can selectively apply an enabling voltage, a disabling voltage, or a sleeping voltage to the WL of the SRAM cell 222 responsive to a state of the SRAM cell 222. As the SRAM cell 222 includes two pass transistors per cell, the sleeping voltage, which is a non-zero value, can reduce leakage of the gates of the two pass transistors of the SRAM cell 222 (e.g., of each of the sleeping memory cells). Further, in related aspects, the source terminal of the SRAM cell 222 can have a source bias voltage applied (e.g., $V_{sb}$) when the SRAM cell 222 is in a sleeping state to further reduce leakage.

The sleeping voltage (e.g., the WL bias voltage) can be selected and/or maintained at less than a threshold voltage of WL pass-gate, such as 100-400 millivolts, which can vary depending on cell technology, design rules, operating voltage, etc. For example, the sleeping voltage can be selected and/or maintained based on:

$$Vwl\_bias < \mu(Vth(\text{word-line})) + 6*\sigma(Vth(\text{word-line})),$$

wherein Vwl_bias is the WL biasing potential (e.g., the disabling voltage), $\mu(Vth(\text{word-line}))$ is the threshold voltage of the pass transistors (M5, M6), and $6*\sigma(Vth(\text{word-line}))$ is the spread of threshold voltage of the pass transistors. Thereby, the sleeping voltage can be selected or maintained to be less than the sum of a threshold voltage of the pass transistors and the spread of the threshold voltage of the pass transistors.

Although the present embodiment illustrated by FIG. 2 illustrates a memory cell with six transistors, embodiments are not so limited. Consistent with embodiments, memory cells can have greater or fewer transistors than that illustrated by FIG. 2.

Figure 3A:
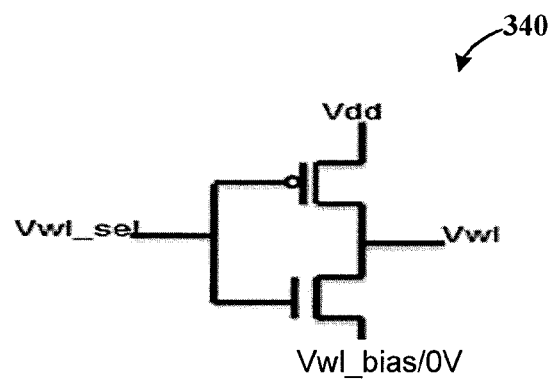
FIG. 3A shows a block diagram of an example word-line driver circuit according to various embodiments of the present disclosure.

FIG. 3A shows a block diagram of an example WL driver circuit according to various embodiments of the present disclosure. In accordance with various embodiments, the memory circuit 102 illustrated by FIG. 1 can include a WL driver circuit 340, as illustrated by FIG. 3A.

As previously discussed, a WL driver circuit 340 can selectively apply voltages to WLs of the memory circuit 102. For example, each row of memory cells in a memory circuit, such as the memory circuit 102 illustrated by FIG. 1, can have a WL driver circuit that selectively applies a voltage to the respective WL of the row. A WL driver circuit 340 can include one or more transistors with gates driven by a WL select signal (e.g., Vwl_select). For example, when a WL of the memory cell is selected, a WL select signal can be low; and when the WL of the memory cell is not selected, the WL select signal can be high, or vice versa.

The WL select signal can drive the output of the WL driver circuit 340 (e.g., Vwl) toward Vdd or toward Vwl_bias/0V. For example, when the memory cell is in a selected block with a selected WL and the memory circuit is in an active cycle, the voltage applied to the WL of the memory cell (Vwl) can be driven to Vdd (e.g., driven to the enabling voltage). When the memory cell is in a selected block with an unselected WL, the voltage applied to the WL of the memory cell Vwl can be driven to Vwl_bias or 0V, depending on the mode of the memory circuit. In various embodiments, the memory circuit can include selection circuitry configured and arranged to select or unselect a block of memory cells and to switch between the Vwl_bias and 0V depending on a mode of the memory circuit.

In various embodiments, when the memory circuit is in a sleep mode, no WL of the memory circuit is selected and the WL select signal for the memory cells during a sleep mode are high (or low, to drive the Vwl to Vwl_bias/0V). Thereby, the voltage applied to the WL of the memory cells are driven to Vwl_bias (e.g., driven to the sleeping voltage). Similarly, a memory cell in a non-selected memory block, during a sleep mode or an active cycle can have a Vwl driven to Vwl_bias as the memory cells are in a sleep state. Vwl_bias and/or 0V can be generated by a WL bias voltage circuitry, such as the WL Bias Voltage Circuitry 100 illustrated by FIG. 1.

Figure 3B:
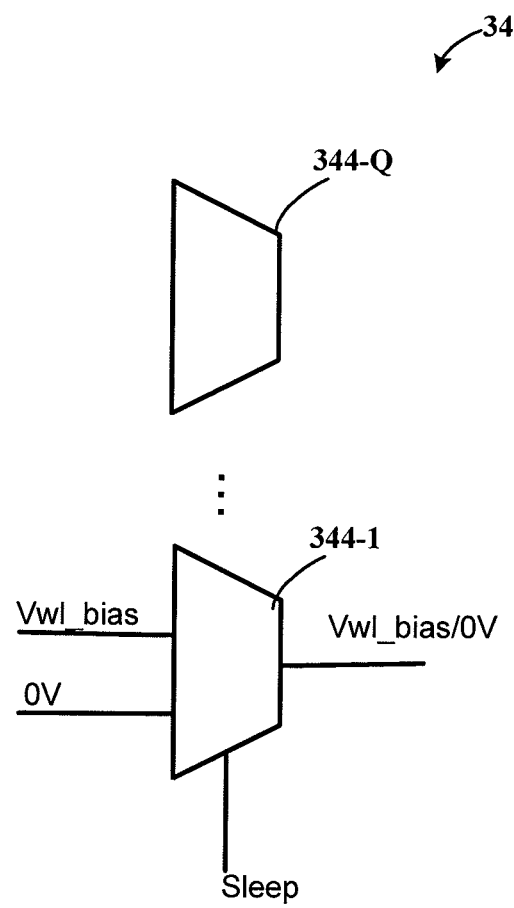
FIG. 3B shows a block diagram of example selection circuitry according to various embodiments of the present disclosure.

FIG. 3B shows a block diagram of example selection circuitry according to various embodiments of the present disclosure. As previously discussed, the selection circuitry 342 can select at least a subset of the plurality of memory cells as a selected block. As illustrated by FIG. 3B, the selection circuitry 342 can include a plurality of selection circuits 344-1 . . . 344-Q. For example, each block of memory cells can include a selection circuit 344-1 . . . 344-Q to allow for the block to be selected and to switch between Vwl_bias and 0V. The selection circuit 344-1 . . . 344-Q, for a block, can be connected to the WL driver circuit (e.g., the WL driver circuit 340 illustrated by FIG. 3A) corresponding to each WL of the block of memory cells. For example, the output of the selection circuitry 342 can provide an indication that the memory cell is in a selected or unselected block and/or that the memory circuit is in a sleep mode or an active cycle.

In various embodiments, a selection circuit, such as selection circuit 344-1, can be comprised of a multiplexer. The sleeping voltage (e.g., Vwl_bias) and disabling voltage (e.g., 0V) can be input to the selection circuit 344-1 as input signals. The selection circuit 344-1 forwards one of the input signals as an output to the respective WL driver circuit based on a select signal. The select signal can include a sleep signal (e.g., a signal corresponding with sleep mode of the memory circuit). For example, when the block of memory cells are in an unselected block, the sleep signal corresponding with the block of memory cells can be enabled (e.g., high) regardless of whether the memory circuit is in an active cycle or a sleep cycle as the memory cells are in a sleep state.

When the block of memory cells are in a selected block, the sleep signal can be enabled or disabled (e.g., high or low) depending on the mode of the memory circuit. For example, when the memory circuit is in active cycle, the sleep signal can be disabled (e.g., low). When the memory circuit is in a sleep mode, the sleep signal can be enabled (e.g., high). The selection circuit 344-1 of a selected block of memory cells can forward the 0V (e.g., disabling voltage) as an output to the respective WL driver circuits of the selected block in response to a low sleep signal. Further, the selection circuit 344-1 of the selected block of memory cells can forward the Vwl_bias (e.g., sleeping voltage) as an output to the respective WL driver circuits of the selected block in response to a high sleep signal. Although the present example illustrates a sleep signal being high to enable the sleep mode, embodiments in accordance with the present disclosure can include a sleep signal being low to enable the sleep mode and a high sleep signal can enable the active cycle.

In various embodiments, the memory circuit can include WL bias voltage circuitry, as previously discussed in connection with FIG. 1. For example, the WL bias voltage circuitry, in some embodiments, can include a first WL bias voltage circuit that generates the sleeping voltage and a second WL bias voltage circuit that generates the disabling voltage. In accordance with some aspects, each block of memory cells can include a first WL bias voltage circuit and a second WL bias voltage circuit. For example, the WL bias voltage circuitry can provide the input signals (e.g., Vwl_bias and 0V) to the selection circuitry 342.

Figure 4:
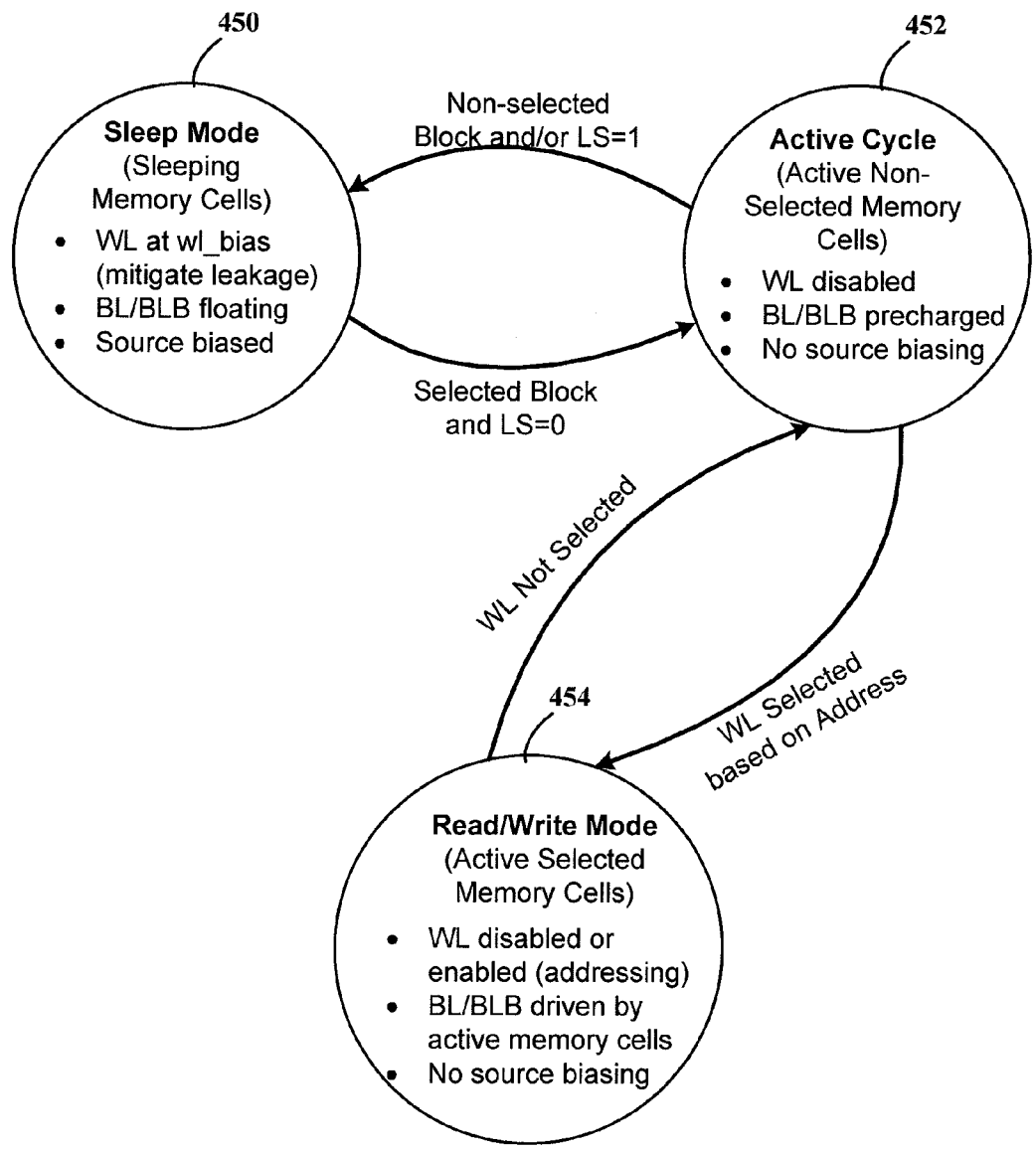
FIG. 4 shows a flow diagram of a memory cell transitioning to different states according to various embodiments of the present disclosure.

FIG. 4 shows a flow diagram of a memory cell transitioning to different states according to various embodiments of the present disclosure. As illustrated by FIG. 4 and previously discussed with regard to FIG. 1, a memory circuit can be in a sleep mode, an active cycle, and/or a read/write mode. Although the read/write mode is illustrated as a separate mode of the memory circuit, a read/write operation (e.g., mode) can be performed by the memory circuit during the active cycle.

When the memory circuit is in a sleep mode 450, each of the memory cells are in a sleep state. A memory circuit can be in a sleep mode when a signal corresponding with sleep mode (e.g., LS) is driven high (e.g., LS=1). By contrast, a memory circuit can be in an active cycle 452 when the signal corresponding with sleep mode is driven low (e.g., LS=0). Although, as may be appreciated by one skilled in the art, embodiments can include the memory cell transitioning to an active cycle when LS is high and transitioning to the sleep mode when LS is driven low. Sleeping memory cells can have a WL driven to the Vwl_bias to mitigate leakage, the BL can be allowed to be floating (e.g., not driven), and the source terminals can be biased.

When the memory circuit is in an active cycle 452, memory cells in a non-selected block are in a sleep state and a block of memory cells is selected. Memory cells in a selected block can transition to an active non-selected state. Active non-selected memory cells can have a WL disabled by applying a disabling voltage to the respective WL, BL pairs can be pre-charged, and the respective source terminals may not be biased.

During the active cycle 452, the memory circuit can transition to a read/write mode 454. When the memory circuit is in a read/write mode 454, a WL of the selected block of memory cells (e.g., the active non-selected memory cells) can be selected based on a decoded address. That is, the WLs of the selected block are enabled or disabled responsive to the selection of the WL. Selecting a WL, as previously discussed, can enable the respective BL pair corresponding with the selected WL to be driven according to the stored values. The BL pairs of the active selected memory cells are driven by the respective active selected memory cells and the respective source terminals are not biased. A particular memory cell can transition between the active non-selected and active selected state responsive to the selection or non-selection of the corresponding WL.

For example, in response to the memory circuit being in a sleep mode 450 (e.g., LS=1), a sleeping voltage can be applied to WLs of all memory cells (e.g., all memory cells are sleeping) to mitigate leakage of pass transistors of the memory cells. In some embodiments, the BL pairs of the memory cells can be allowed to be floating and a source bias voltage can be applied to the source terminals of the memory cells. In response to the memory circuit transitioning from the sleep mode 450 to an active cycle 454 (e.g., LS=0), a block of the memory cells can be selected, and pass transistors of the memory cells of the selected block can be disabled by discharging the WLs of the selected block to a disabling voltage. Further, in some embodiments, the BL pairs of the selected block of memory cells can be pre-charged and the source bias voltage can be discharged from the source terminals of the selected block of memory cells (e.g., active non-selected memory cells). During a read/write mode, a shared WL of the selected block can be selected to select (e.g., activate for a read/write operation) the respective memory cells and pass transistors of the selected memory cells can be enabled by applying an enabling voltage to the WL of the selected memory cells.

Figure 5:
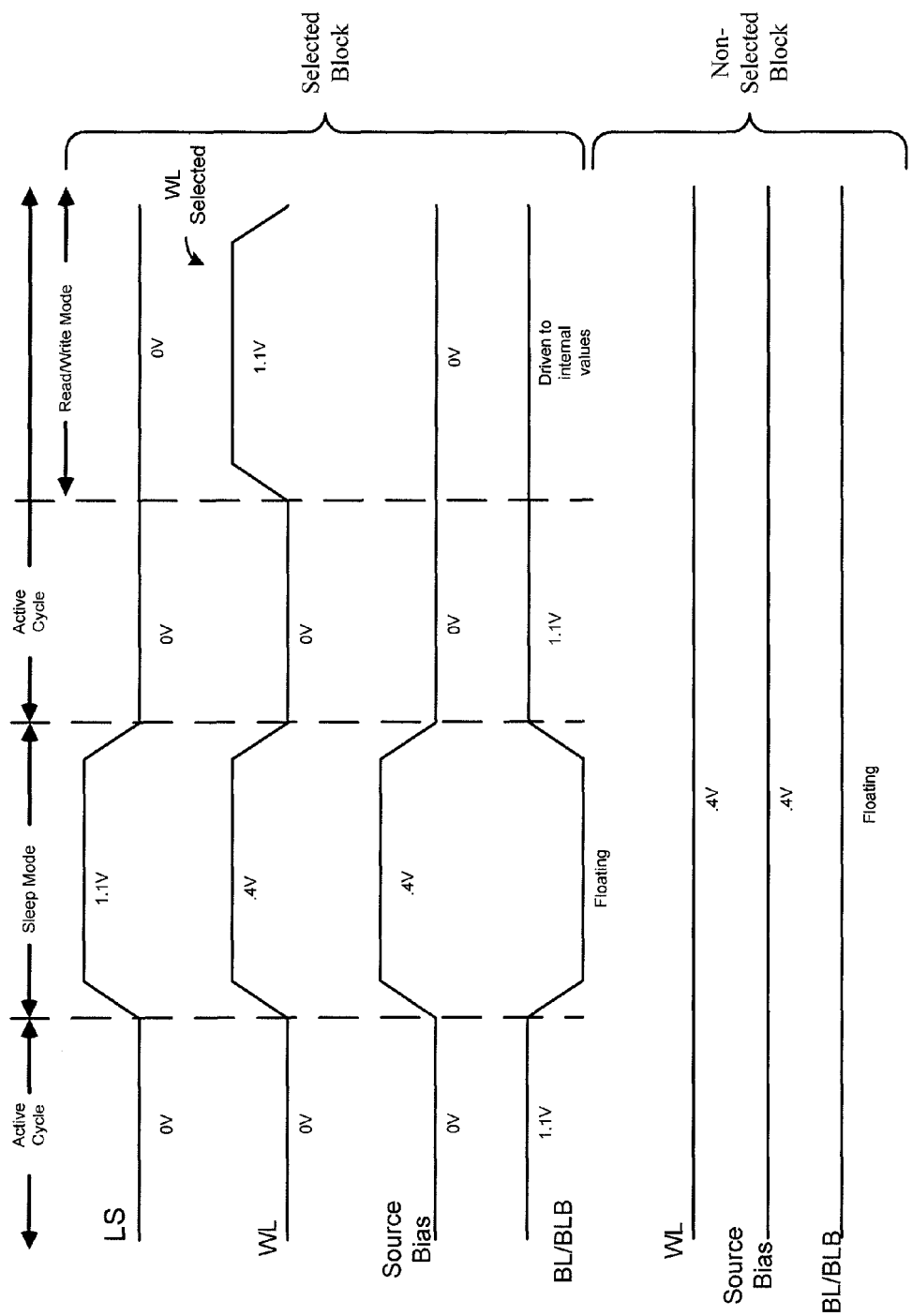
FIG. 5 shows a timing diagram of an example memory circuit according to various embodiments of the present disclosure.

FIG. 5 shows a timing diagram of an example memory circuit according to various embodiments of the present disclosure. For example, the timing diagram can correspond with the transitioning states of a memory cell, as illustrated by FIG. 4.

As illustrated by FIG. 5, a memory circuit is in an active cycle and/or a read/write mode when a signal corresponding with a sleep mode is low (e.g., LS=0V). During an active cycle, memory cells in a selected block have a disabling voltage (e.g., WL=0V) applied to their respective WLs, no source biasing (e.g., Source Bias=0V), and the BL pairs are pre-charged (e.g., BL/BLB=1.1 V). Memory cells in a non-selected block of memory cells have a sleeping voltage applied to their respective WLs (e.g., WL=0.4V), a source bias voltage applied to respective source terminals (e.g., Source bias=0.4V), and BL pairs are allowed to be floating.

The memory circuit can transition to a sleep mode when the signal corresponding with sleep mode is high (e.g., LS=1.1 V). During a sleep mode, all of the memory cells of the memory circuit have a sleeping voltage applied to their WLs (e.g., WL=0.4V), a source bias voltage applied to respective source terminals (e.g., Source bias=0.4V), and BL pairs are allowed to be floating.

During a read/write mode, a WL of the selected block is selected and pass transistors are enabled by applying an enabling voltage (e.g., WL=1.1V) to the respective WL, no source bias voltage is applied, and the BL pairs are driven by the active selected memory cells to their internal values. Although the embodiment of FIG. 5 illustrates only one WL in the selected and non-selected block, one of ordinary skill in the art will appreciate that the selected block and the non-selected blocks may contain a plurality of WLs. Thereby, when the memory circuit is in a read/write mode, a portion of the memory cells in the selected block are active non-selected memory cells (e.g., are in an selected block with a non-selected WL). The active non-selected memory cells can have a disabling voltage (e.g., WL=0V) applied to their respective WLs, no source biasing (e.g., Source Bias=0V), and/or the BL pairs are pre-charged (e.g., BL/BLB=1.1V).

As an example, in various embodiments, pass transistors of active selected memory cells of a memory circuit are enabled by applying an enabling voltage to WLs of the active selected memory cells, pass transistors of active non-selected memory cells of the memory circuit are disabled by applying a disabling voltage to WLs of the active non-selected memory cells, and leakage of pass transistors of sleeping memory cells are mitigated by applying a sleeping voltage to WLs of the sleeping memory cells. In such an instance, the memory circuit can be in an active cycle (e.g., transitioned to), a block of memory cells is selected that includes the active selected and active non-selected memory cells, and a shared WL corresponding to the active selected memory cells is selected. In some related embodiments, the BLs of the selected block of memory cells can be pre-charged. Further, upon transitioning the memory circuit from the active cycle to a sleep mode, the sleeping voltage can be applied to the plurality of memory cells to mitigate leakage, BLs can be allowed to be floating, and/or source terminals can be biased, as previously discussed.

Various blocks, modules or other circuits may be implemented to carry out one or more of the operations and activities described herein and/or shown in the figures. In these contexts, a "block" (also sometimes "circuit", "logic circuitry", or "module") can be implemented using a circuit that carries out one or more of these or related operations/activities. In various embodiments, a hard-wired control block can be used to minimize the area for such an implementation in case a limited flexibility is sufficient. Alternatively and/or in addition, in certain of the above-discussed embodiments, one or more modules are discreet logic circuits or programmable logic circuits configured and arranged for implementing these operations/activities.

Based upon the above discussion and illustrations, those skilled in the art will readily recognize that various modifications and changes may be made to the various embodiments without strictly following the exemplary embodiments and applications illustrated and described herein. For example, an apparatus can include different types of memory cells and configurations than illustrated by FIGS. 1 and 2. Such modifications do not depart from the true spirit and scope of various aspects of the invention, including aspects set forth in the claims.

What is claimed is:

1. An apparatus comprising:
    a memory circuit including a plurality of rows of memory cells, each memory cell in a corresponding row having pass transistors connected to a shared word-line;
    a word-line driver circuit configured and arranged to:
        enable pass transistors of a first set of memory cells of the memory circuit by applying a first voltage to word-lines of the first set of memory cells;
        disable pass transistors of a second set of memory cells of the memory circuit by applying a second voltage to word-lines of the second set of memory cells; and
        mitigate leakage of pass transistors of a third set of memory cells of the memory circuit by applying a third voltage to word-lines of the third set of memory cells, wherein the third voltage is between the first and second voltages.

2. The apparatus of claim 1, wherein responsive to the memory circuit being in an active cycle,
    the first set of memory cells include memory cells in a selected block of memory cells with a selected shared word-line;
    the second set of memory cells include memory cells in the selected block with a non-selected shared word-line; and
    the third set of memory cells include memory cells in a non-selected block of memory cells.

3. The apparatus of claim 1, wherein the word-line driver circuit is configured and arranged to mitigate leakage of pass transistors of the plurality of rows of memory cells by applying the third voltage to the word-lines of the memory cells in response to the memory circuit being in a sleep mode.

4. The apparatus of claim 1, wherein the memory cells include SRAM cells including two pass transistors per SRAM cell and the third voltage is a non-zero value that reduces leakage of the gates of the two pass transistors of each of the third set of memory cells.

5. The apparatus of claim 1, further including a word-line bias circuit configured and arranged to generate the third voltage.

6. The apparatus of claim 1, further including selection circuitry configured and arranged to select at least a subset of the plurality of memory cells as a selected block responsive to at least one decoded address.

7. The apparatus of claim 1, wherein the word-line driver circuit is configured and arranged to apply the second voltage to the word-lines of the second set of memory cells by connecting the respective word-lines to ground and thereby discharging the word-lines of the second set of memory cells.

8. The apparatus of claim 1, wherein the first voltage provides a threshold gate-to-source voltage differential to create a conducting path between source and drain terminals of the respective pass transistors.

9. The apparatus of claim 1, wherein the third voltage is less than a threshold voltage of the first voltage.

10. The apparatus of claim 1, further including a source biasing circuit configured and arranged to apply a source bias voltage to source terminals of the third set of memory cells.

11. The apparatus of claim 1, further including row decoder circuitry configured and arranged to select the first set of memory cells by selecting respective word-lines of the first set of memory cells responsive to a decoded address.

12. A method comprising:
enabling pass transistors of a first set of memory cells of a memory circuit by applying a first voltage to word-lines of the first set of memory cells, the memory circuit including:
   a plurality of rows of memory cells, and
   each memory cell in a corresponding row having pass transistors connected to a shared word-line;
disabling pass transistors of a second set of memory cells of the memory circuit by applying a second voltage to word-lines of the second set of memory cells; and
mitigating leakage of pass transistors of a third set of memory cells of the memory circuit by applying a third voltage to word-lines of the third set of memory cells, wherein the third voltage is between the first and second voltages.

13. The method of claim 12, further including:
transitioning the memory circuit into an active cycle;
selecting a block of memory cells; and
selecting a shared word-line of the block of memory cells, wherein:
   the first set of memory cells are in the selected block with the selected shared word-line;
   the second set of memory cells are in the selected block with a non-selected shared word-line; and
   the third set of memory cells are in a non-selected block of memory cells.

14. The method of claim 13, further including pre-charging bit-lines of the selected block of memory cells.

15. The method of claim 12, further including:
transitioning the memory circuit into a sleep mode; and
applying the third voltage to word-lines of the plurality of memory cells, wherein the plurality of memory cells include sleeping memory cells.

16. A method, comprising:
mitigating leakage of pass transistors of memory cells of a memory circuit by applying a sleeping voltage to word-lines of the memory cells responsive to the memory circuit being in a sleep mode, wherein the memory circuit includes:
   a plurality of rows of memory cells, and
   each memory cell in a corresponding row having pass transistors connected to a shared word-line;
in response to the memory circuit transitioning from the sleep mode to an active cycle:
   selecting a block of the memory cells;
   disabling pass transistors of the memory cells of the selected block by discharging the word-lines of the selected block to a disabling voltage;
   selecting a shared word-line of the selected block to select the respective memory cells sharing the word-line; and
   enabling pass transistors of the selected memory cells by applying an enabling voltage to the word-line of the selected memory cells, wherein the sleeping voltage is between the enabling voltage and the disabling voltage.

17. The method of claim 16, further including:
applying a source bias voltage to the source terminals of the memory cells responsive to the memory circuit being in the sleep mode; and
discharging the source bias voltage from the source terminals of the selected block of memory cells.

18. The method of claim 17, further including:
responsive to the memory circuit transitioning from the active mode to the sleep mode, mitigating leakage of the pass transistors of the selected block of memory cells by:
   applying the sleeping voltage to the word-lines of memory cells of the selected block with non-selected word-lines; and
   discharging the enabling voltage from the word-lines of the selected memory cells to provide the sleeping voltage; and
   applying a source bias voltage to respective source terminals of the selected block of memory cells.

19. The method of claim 16, further including selecting between the sleeping voltage and the disabling voltage to apply to respective word-lines responsive to a signal corresponding with the sleep mode of the memory circuit.

20. The method of claim 16, further including selecting the sleeping voltage to be less than a sum of a threshold voltage of the pass transistors and a spread of the threshold voltage of the pass transistors.

* * * * *